US012699322B2

(12) United States Patent
Hayashi et al.

(10) Patent No.: US 12,699,322 B2
(45) Date of Patent: Aug. 4, 2026

(54) PHOTOSENSITIVE RESIN COMPOSITION, PHOTOSENSITIVE DRY FILM, LAYERED PRODUCT, AND PATTERN FORMATION METHOD

(71) Applicant: Shin-Etsu Chemical Co., Ltd., Tokyo (JP)

(72) Inventors: Kumiko Hayashi, Annaka (JP); Kyoko Soga, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 606 days.

(21) Appl. No.: 17/626,544

(22) PCT Filed: Jul. 13, 2020

(86) PCT No.: PCT/JP2020/027174

§ 371 (c)(1),
(2) Date: Jan. 12, 2022

(87) PCT Pub. No.: WO2021/010360

PCT Pub. Date: Jan. 21, 2021

(65) Prior Publication Data

US 2022/0236644 A1 Jul. 28, 2022

(30) Foreign Application Priority Data

Jul. 16, 2019 (JP) ................................ 2019-130851

(51) Int. Cl.

*G03F 7/075* (2006.01)
*G03F 7/004* (2006.01)
*G03F 7/32* (2006.01)
*G03F 7/38* (2006.01)

(52) U.S. Cl.

CPC .......... *G03F 7/0757* (2013.01); *G03F 7/0045* (2013.01); *G03F 7/32* (2013.01); *G03F 7/38* (2013.01)

(58) Field of Classification Search

CPC ....... G03F 7/0045; G03F 7/075; G03F 7/0757
See application file for complete search history.

(56) References Cited

U.S. PATENT DOCUMENTS

2002/0055550 A1 5/2002 Kato et al.
2005/0227171 A1 10/2005 Kawana et al.
2008/0182087 A1* 7/2008 Kato .................... H01L 21/312 257/E21.259
2011/0143092 A1* 6/2011 Asai ...................... C08G 77/52 428/141
2013/0113083 A1* 5/2013 Kondo .................... C08L 83/14 523/435
2013/0196114 A1* 8/2013 Urano ...................... G03F 7/20 528/27
2014/0011126 A1 1/2014 Tagami et al.
2016/0315025 A1* 10/2016 Kondo .................. H01L 23/296
2016/0358833 A1* 12/2016 Soga .................... C08G 59/621
2017/0009022 A1* 1/2017 Kondo ...................... C08J 5/18
2017/0313904 A1* 11/2017 Kondo .................... C08L 83/14
2018/0004088 A1* 1/2018 Maruyama ................ C08J 5/18
2019/0049844 A1 2/2019 Maruyama et al.

FOREIGN PATENT DOCUMENTS

CN 109388022 A 2/2019
JP 2002-88158 A 3/2002
JP 2012-1668 A 1/2012
JP 2013210607 A * 10/2013 .............. G02F 1/13
JP 2014142458 A * 7/2014
JP 2017-2279 A 1/2017
JP 2017-49327 A 3/2017
JP 2017049327 A * 3/2017

OTHER PUBLICATIONS

English translation of JP2014142458. (Year: 2014).*
English translation of JP2017049327. (Year: 2017).*
English translation of JP2013210607. (Year: 2013).*
International Search Report dated Sep. 29, 2020, issued in counterpart International Application No. PCT/JP2020/027174 (2 pages).
Office Action dated Nov. 6, 2024 issued in counterpart CN application No. 202080050683.5. (6 pages).

* cited by examiner

*Primary Examiner* — Mark F. Huff
*Assistant Examiner* — Anna Malloy
(74) *Attorney, Agent, or Firm* — WHDA, LLP

(57) ABSTRACT

The coating formed from the photosensitive resin composition has excellent resolution and improved microprocessing properties, as well as satisfactory reliability in terms of adhesion and crack resistance, resolution, and flexibility. The photosensitive resin composition includes (A) a polymer including a silicone skeleton and (B) photo-acid generators, wherein the photo-acid generators (B) comprise (B1) a photo-acid generator which is an onium salt and (B2) a photo-acid generator which is not an onium salt.

13 Claims, No Drawings

PHOTOSENSITIVE RESIN COMPOSITION, PHOTOSENSITIVE DRY FILM, LAYERED PRODUCT, AND PATTERN FORMATION METHOD

TECHNICAL FIELD

This invention relates to a photosensitive resin composition, photosensitive dry film, laminate, and pattern forming process.

BACKGROUND ART

In the prior art, photosensitive protective films for semiconductor chips and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 1 discloses a photosensitive silicone composition having improved flexibility. This photosensitive silicone composition is curable at low temperature and forms a coating which is fully reliable with respect to moisture resistant adhesion and other properties, but is less resistant against chemicals such as photoresist strippers having a high dissolving power, typically N-methyl-2-pyrrolidone.

To overcome the problem, Patent Document 2 proposes a photosensitive silicone composition based on a silphenylene skeleton-containing silicone polymer. This photosensitive silicone composition is improved in chemical resistance against photoresist strippers and the like, but still has the problem that the cured coating peels from the substrate or cracks in a thermal cycling test (repeating 1,000 cycles a test of holding at −25° C. for 10 minutes and holding at 125° C. for 10 minutes). A further improvement in the reliability of such resin compositions is desired.

PRIOR ART DOCUMENTS

Patent Documents

Patent Document 1: JP-A 2002-088158
Patent Document 2: JP-A 2012-001668

SUMMARY OF INVENTION

Technical Problem

An object of the invention, which has been made under the above-mentioned circumstances, is to provide a photosensitive resin composition, a photosensitive dry film, a laminate using the composition or dry film, and a pattern forming process, the composition having excellent film properties including crack resistance and adhesion to substrates, typically to substrates for use in electronic parts and semiconductor chips, especially circuit boards and being capable of forming a cured product layer (or cured coating) which is fully reliable as electric/electronic part-protecting coating and substrate-bonding coating.

Solution to Problem

Making extensive investigations to attain the above object, the inventors have found that the outstanding problems are solved by a photosensitive resin composition comprising a silicone skeleton-containing polymer, a photoacid generator in the form of an onium salt and a photoacid generator other than an onium salt. The invention is predicated on this finding.

Accordingly, the invention provides a photosensitive resin composition, photosensitive dry film, laminate, and pattern forming process, as defined below.

1. A photosensitive resin composition comprising (A) a silicone skeleton-containing polymer and (B) a photoacid generator,
   wherein the photoacid generator (B) contains (B1) a photoacid generator in the form of an onium salt and (B2) a photoacid generator other than an onium salt.
2. The photosensitive resin composition of 1 wherein the silicone skeleton-containing polymer (A) comprises repeat units having the formulae (a1) to (a4) and the formulae (b1) to (b4):

[Chem. 1]

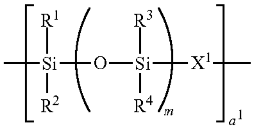
(a1)

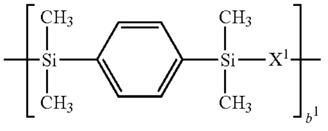
(b1)

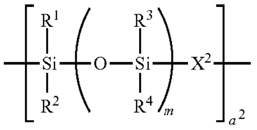
(a2)

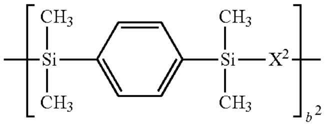
(b2)

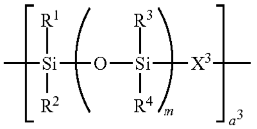
(a3)

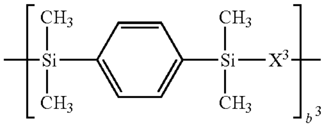
(b3)

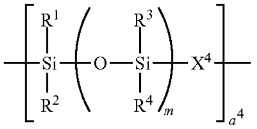
(a4)

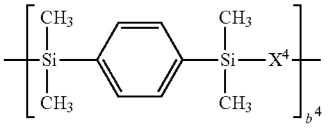
(b4)

wherein $R^1$ to $R^4$ are each independently a $C_1$-$C_8$ monovalent hydrocarbon group, m is an integer of 1 to 600, $a^1$ to $a^4$ and $b^1$ to $b^4$ are numbers in the range: $0 \le a^1 < 1$, $0 \le a^2 < 1$, $0 \le a^3 < 1$, $0 \le a^4 < 1$, $0 \le b^1 < 1$, $0 \le b^2 < 1$, $0 \le b^3 < 1$, $0 \le b^4 < 1$, $0 < a^1+a^2+a^3+a^4 < 1$, $0 < b^1+b^2+b^3+b^4 < 1$, and $a^1+a^2+a^3+a^4+b^1+b^2+b^3+b^4=1$, $X^1$ is a divalent group having the formula (X1), $X^2$ is a divalent group having the formula (X2), $X^3$ is a divalent group having the formula (X3), $X^4$ is a divalent group having the formula (X4),

[Chem. 2]

(X1)

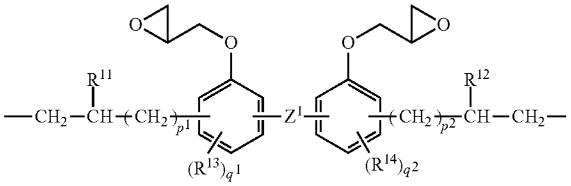

wherein $Z^1$ is a single bond, methylene group, propane-2,2-diyl group, 1,1,1,3,3,3-hexafluoropropane-2,2-diyl group or fluorene-9,9-diyl group, $R^{11}$ and $R^{12}$ are each independently hydrogen or methyl, $R^{13}$ and $R^{14}$ are each independently a $C_1$-$C_4$ alkyl group or $C_1$-$C_4$ alkoxy group, $p^1$ and $p^2$ are each independently an integer of 0 to 7, $q^1$ and $q^2$ are each independently an integer of 0 to 2,

[Chem. 3]

(X2)

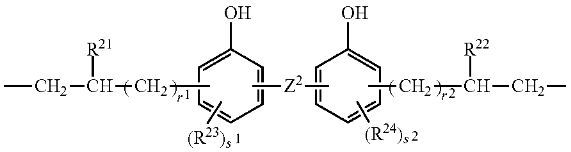

wherein $Z^2$ is a single bond, methylene group, propane-2,2-diyl group, 1,1,1,3,3,3-hexafluoropropane-2,2-diyl group or fluorene-9,9-diyl group, $R^{21}$ and $R^{22}$ are each independently hydrogen or methyl, $R^{23}$ and $R^{24}$ are each independently a $C_1$-$C_4$ alkyl group or $C_1$-$C_4$ alkoxy group, $r^1$ and $r^2$ are each independently an integer of 0 to 7, $s^1$ and $s^2$ are each independently an integer of 0 to 2,

[Chem. 4]

(X3)

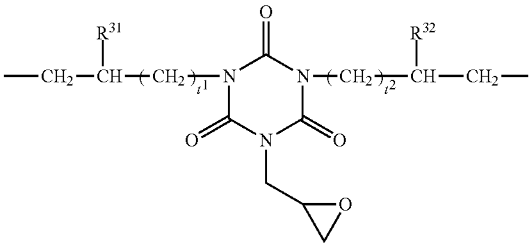

wherein $R^{31}$ and $R^{32}$ are each independently hydrogen or methyl, $t^1$ and $t^2$ are each independently an integer of 0 to 7,

[Chem. 5]

(X4)

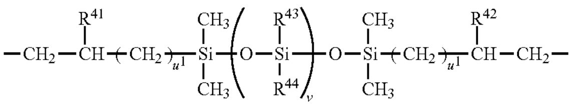

wherein $R^{41}$ and $R^{42}$ are each independently hydrogen or methyl, $R^{43}$ and $R^{44}$ are each independently a $C_1$-$C_8$ monovalent hydrocarbon group, $u^1$ and $u^2$ are each independently an integer of 0 to 7, and v is an integer of 0 to 600.

3. The photosensitive resin composition of 1 or 2, further comprising (C) a crosslinker.

4. The photosensitive resin composition of any one of 1 to 3, further comprising (D) a solvent.

5. The photosensitive resin composition of any one of 1 to 4, further comprising (E) a quencher.

6. A photosensitive resin coating obtained from the photosensitive resin composition of any one of 1 to 5.

7. A photosensitive dry film comprising a support film and the photosensitive resin coating of 6 thereon.

8. A laminate comprising a substrate and the photosensitive resin coating of 6 thereon.

9. A pattern forming process comprising the steps of:
   (i) applying the photosensitive resin composition of any one of 1 to 5 onto a substrate to form a photosensitive resin coating thereon,
   (ii) exposing the photosensitive resin coating to radiation, and
   (iii) developing the exposed photosensitive resin coating in a developer to form a pattern.

10. A pattern forming process comprising the steps of:
   (i') applying the photosensitive dry film of 7 onto a substrate to form a photosensitive resin coating thereon,
   (ii) exposing the photosensitive resin coating to radiation, and
   (iii) developing the exposed photosensitive resin coating in a developer to form a pattern.

11. The pattern forming process of 9 or 10, further comprising the step (iv) of post-curing the patterned photosensitive resin coating at a temperature of 100 to 250° C.

Advantageous Effects of Invention

Using the photosensitive resin composition of the invention, a coating is readily formed. The coating has excellent resolution and improved microprocessing properties, as well as satisfactory reliability in terms of adhesion and crack resistance, resolution, and flexibility.

DESCRIPTION OF EMBODIMENTS

The invention provides a photosensitive resin composition comprising (A) a silicone skeleton-containing polymer and (B) a photoacid generator. The photoacid generator (B) contains both (B1) a photoacid generator in the form of an onium salt and (B2) a photoacid generator other than an onium salt.

[(A) Silicone Skeleton-Containing Polymer]

The silicone skeleton-containing polymer as component (A) is preferably a polymer comprising repeat units having the formulae (a1) to (a4) and the formulae (b1) to (b4), though not limited thereto. These units are also referred to as repeat units (a1) to (a4) and (b1) to (b4), hereinafter.

[Chem. 6]

(a1)

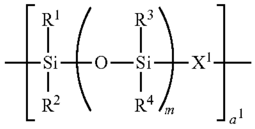

(b1)

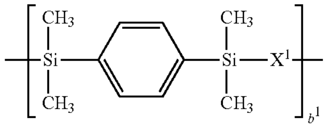

(a2)

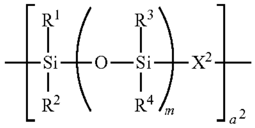

(b2)

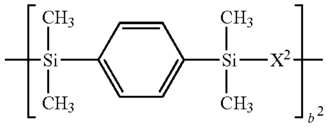

(a3)

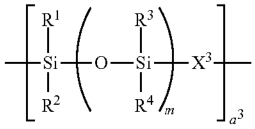

(b3)

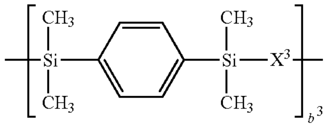

(a4)

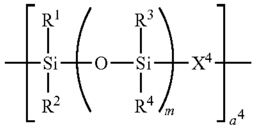

(b4)

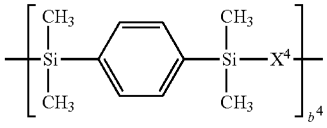

In formulae (a1) to (a4), $R^1$ to $R^4$ are each independently a $C_1$-$C_8$ monovalent hydrocarbon group, and m is an integer of 1 to 600. When m is an integer of at least 2, groups $R^3$ may be identical or different and groups $R^4$ may be identical or different. In the repeat units (a1) to (a4), where at least two siloxane units are included, the siloxane units may be all identical, or at least two different siloxane units may be included. Where at least two different siloxane units are included (i.e., m is an integer of at least 2), the siloxane units may be bonded either randomly or alternately, or a plurality of blocks each consisting of identical siloxane units may be included.

The monovalent hydrocarbon groups may be straight, branched or cyclic. Examples include alkyl groups such as methyl, ethyl, propyl, hexyl, cyclohexyl and structural isomers thereof, and aryl groups such as phenyl. Of these, methyl and phenyl are preferred because of availability of reactants.

In formulae (a1) to (a4), m is an integer of 1 to 600, preferably 1 to 400, more preferably 1 to 200.

In formulae (a1) and (b1), $X^1$ is a divalent group having the formula (X1).

[Chem. 7]

(X1)

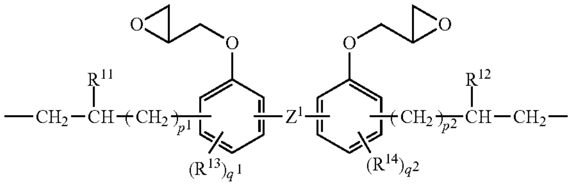

In formula (X1), $Z^1$ is a single bond, methylene, propane-2,2-diyl, 1,1,1,3,3,3-hexafluoropropane-2,2-diyl or fluorene-9,9-diyl. $R^{11}$ and $R^{12}$ are each independently hydrogen or methyl. $R^{13}$ and $R^{14}$ are each independently a $C_1$-$C_4$ alkyl group or $C_1$-$C_4$ alkoxy group, $p^1$ and $p^2$ are each independently an integer of 0 to 7, and $q^1$ and $q^2$ are each independently an integer of 0 to 2.

The alkyl group may be straight, branched or cyclic, and examples thereof include methyl, ethyl, propyl, butyl, and structural isomers thereof. The alkoxy group may be straight, branched or cyclic, and examples thereof include methoxy, ethoxy, propoxy, butoxy, and structural isomers.

In formulae (a2) and (b2), $X^2$ is a divalent group having the formula (X2).

[Chem. 8]

(X2)

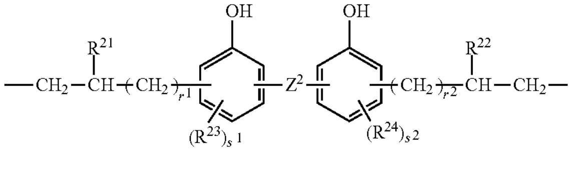

In formula (X2), $Z^2$ is a single bond, methylene, propane-2,2-diyl, 1,1,1,3,3,3-hexafluoropropane-2,2-diyl or fluorene-9,9-diyl. $R^{21}$ and $R^{22}$ are each independently hydrogen or methyl. $R^{23}$ and $R^{24}$ are each independently a $C_1$-$C_4$ alkyl group or $C_1$-$C_4$ alkoxy group, $r^1$ and $r^2$ are each independently an integer of 0 to 7, and $s^1$ and $s^2$ are each independently an integer of 0 to 2. Examples of the alkyl or alkoxy group are as exemplified above.

In formulae (a3) and (b3), $X^3$ is a divalent group having the formula (X3).

[Chem. 9]

(X3)

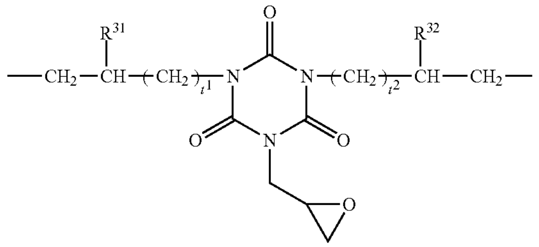

In formula (X3), $R^{31}$ and $R^{32}$ are each independently hydrogen or methyl, and $t^1$ and $t^2$ are each independently an integer of 0 to 7.

In formulae (a4) and (b4), $X^4$ is a divalent group having the formula (X4).

[Chem. 10]

(X4)

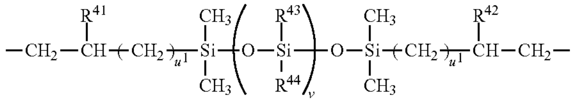

In formula (X4), $R^{41}$ and $R^{42}$ are each independently hydrogen or methyl. $R^{43}$ and $R^{44}$ are each independently a $C_1$-$C_8$ monovalent hydrocarbon group, and $u^1$ and $u^2$ are each independently an integer of 0 to 7. The subscript v is an integer of 0 to 600, preferably 0 to 400, more preferably 0 to 200. Examples of the monovalent hydrocarbon group are as exemplified above for $R^1$ to $R^4$. In formula (X4), when v is an integer of at least 2, siloxane units with subscript v may be bonded either randomly or alternately, or a plurality of blocks each consisting of identical siloxane units may be included.

The silicone skeleton-containing polymer (A) preferably has a weight average molecular weight (Mw) of 3,000 to 500,000, more preferably 5,000 to 200,000. It is noted throughout the disclosure that Mw is measured by gel permeation chromatography (GPC) versus polystyrene standards using tetrahydrofuran as the eluent.

In formulae (a1) to (a4) and (b1) to (b4), $a^1$ to $a^4$ and $b^1$ to $b^4$ are numbers in the range: $0 \le a^1 < 1$, $0 \le a^2 < 1$, $0 \le a^3 < 1$, $0 \le a^4 < 1$, $0 \le b^1 < 1$, $0 \le b^2 < 1$, $0 \le b^3 < 1$, $0 \le b^4 < 1$, $0 < a^1+a^2+a^3+a^4 < 1$, $0 < b^1+b^2+b^3+b^4 < 1$, and $a^1+a^2+a^3+a^4+b^1+b^2+b^4+b^4=1$, preferably in the range: $0 \le a^1 \le 0.8$, $0 \le a^2 \le 0.8$, $0 \le a^3 \le 0.8$, $0 \le a^4 \le 0.8$, $0 \le b^1 \le 0.95$, $0 \le b^2 \le 0.95$, $0 \le b^3 \le 0.95$, $0 \le b^4 \le 0.95$, $0.05 \le a^1+a^2+a^3+a^4 \le 0.8$, $0.2 \le b^1+b^2+b^3+b^4 \le 0.95$, and $a^1+a^2+a^3+a^4+b^1+b^2+b^3+b^4=1$,
more preferably in the range: $0 \le a^1 \le 0.7$, $0 \le a^2 \le 0.7$, $0 \le a^3 \le 0.7$, $0 \le a^4 \le 0.7$, $0 \le b^1 \le 0.9$, $0 \le b^2 \le 0.9$, $0 \le b^3 \le 0.9$, $0 \le b^4 \le 0.9$, $0.1 \le a^1+a^2+a^3+a^4 \le 0.7$, $0.3 \le b^1+b^2+b^3+b^4 \le 0.9$, and $a^1+a^2+a^3+a^4+b^1+b^2+b^3+b^4=1$.

Preferably, the silicone skeleton-containing polymer (A) has crosslinking groups such as epoxy and hydroxy groups or crosslinking reaction-susceptible reactive sites in the molecule. That is, the polymer preferably contains repeat units of at least one type selected from repeat units (a1) to (a3) and repeat units of at least one type selected from repeat units (b1) to (b3). In this embodiment, $a^1$ to $a^4$ and $b^1$ to $b^4$ in formulae (a1) to (a4) and (b1) to (b4) are preferably numbers in the range: $0 \le a^1 < 1$, $0 \le a^2 < 1$, $0 \le a^3 < 1$, $0 \le a^4 < 1$, $0 \le b^1 < 1$, $0 \le b^2 < 1$, $0 \le b^3 < 1$, $0 \le b^4 < 1$, $0 < a^1+a^2+a^3 < 1$, $0 < b^1+b^2+b^3 < 1$, and $a^1+a^2+a^3+a^4+b^1+b^2+b^3+b^4=1$,
more preferably in the range: $0 \le a^1 \le 0.8$, $0 \le a^2 \le 0.8$, $0 \le a^3 \le 0.8$, $0 \le a^4 \le 0.8$, $0 \le b^1 \le 0.95$, $0 \le b^2 \le 0.95$, $0 \le b^3 \le 0.95$, $0 \le b^4 \le 0.95$, $0.05 \le a^1+a^2+a^3 \le 0.8$, $0.2 \le b^1+b^2+b^3 \le 0.95$, and $a^1+a^2+a^3+a^4+b^1+b^2+b^3+b^4=1$,
even more preferably in the range: $0 \le a^1 \le 0.7$, $0 \le a^2 \le 0.7$, $0 \le a^3 \le 0.7$, $0 \le a^4 \le 0.7$, $0 \le b^1 \le 0.9$, $0 \le b^2 \le 0.9$, $0 \le b^3 \le 0.9$, $0 \le b^4 \le 0.9$, $0.1 \le a^1+a^2+a^3 \le 0.7$, $0.3 \le b^1+b^2+b^3 \le 0.9$, and $a^1+a^2+a^3+a^4+b^1+b^2+b^3+b^4=1$.

Especially, the silicone skeleton-containing polymer (A) preferably contains repeat units (a3) and repeat units (b3). In this embodiment, $a^1$ to $a^4$ and b1 to $b^4$ in formulae (a1) to (a4) and (b1) to (b4) are preferably numbers in the range: $0 \le a^1 < 1$, $0 \le a^2 < 1$, $0 < a^3 < 1$, $0 \le a^4 < 1$, $0 \le b^1 < 1$, $0 \le b^2 < 1$, $0 < b^3 < 1$, $0 \le b^4 < 1$, $0 < a^1+a^2+a^3+a^4 < 1$, $0 < b^1+b^2+b^3+b^4 < 1$, and $a^1+a^2+a^3+a^4+b^1+b^2+b^3+b^4=1$,
more preferably in the range: $0 \le a^1 < 0.8$, $0 \le a^2 < 0.8$, $0 \le a^3 < 0.8$, $0 \le a^4 < 0.8$, $0 \le b^1 < 0.95$, $0 \le b^2 < 0.95$, $0 \le b^3 < 0.95$, $0 \le b^4 < 0.95$, $0.05 \le a^1+a^2+a^3+a^4 \le 0.8$, $0.2 \le b^1+b^2+b^3+b^4 \le 0.95$, and $a^1+a^2+a^3+a^4+b^1+b^2+b^3+b^4=1$,
even more preferably in the range: $0 \le a^1 < 0.7$, $0 \le a^2 < 0.7$, $0 < a^3 \le 0.7$, $0 \le a^4 < 0.7$, $0 \le b^1 < 0.9$, $0 \le b^2 < 0.9$, $0 < b^3 \le 0.9$, $0 \le b^4 < 0.9$, $0.1 \le a^1+a^2+a^3+a^4 \le 0.7$, $0.3 \le b^1+b^2+b^3+b^4 \le 0.9$, and $a^1+a^2+a^3+a^4+b^1+b^2+b^3+b^4=1$.

In the polymer, the foregoing repeat units may be bonded randomly or blockwise (to form a block copolymer). In each repeat unit, siloxane units may be bonded randomly or plural blocks each consisting of siloxane units of the same type may be included. The silicone resin preferably has a silicone (siloxane unit) content of 30 to 80% by weight.

The silicone skeleton-containing polymer (A) has a function of providing a sufficient film-forming ability. A resin film obtained therefrom has improved adhesion to laminates, substrates and the like, a pattern forming ability, crack resistance, and heat resistance.

The silicone skeleton-containing polymer may be used alone or in admixture of two or more as component (A).

[Preparation of Silicone Skeleton-Containing Polymer]

The silicone skeleton-containing polymer may be prepared by addition polymerization of a compound having the formula (1), a compound having the formula (2), and at least one compound selected from a compound having the formula (3), a compound having the formula (4), a compound having the formula (5), and a compound having the formula (6), all shown below, in the presence of a metal catalyst. These compounds are also referred to as compounds (1) to (6), respectively.

[Chem. 11]

(1)

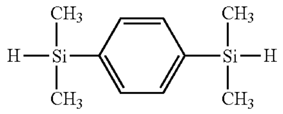

(2)

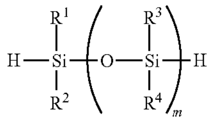

Herein $R^1$ to $R^4$ and m are as defined above.

[Chem. 12]

(3)

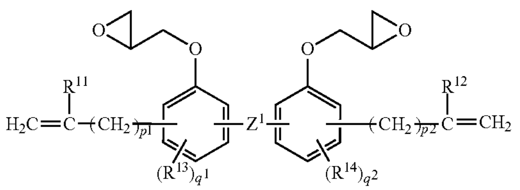

(4)

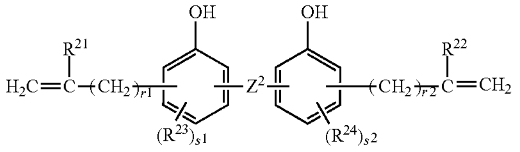

(5)

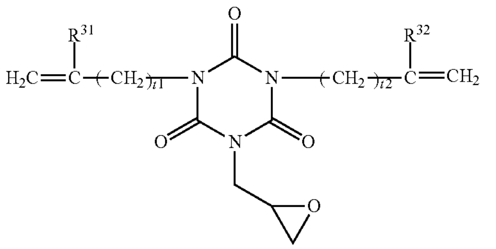

(6)

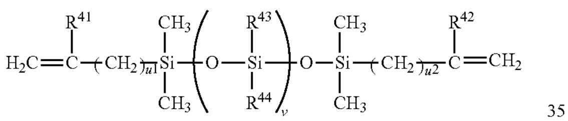

Herein $R^{11}$ to $R^{14}$, $R^{21}$ to $R^{24}$, $R^{31}$, $R^{32}$, $R^{41}$ to $R^{44}$, $Z^1$, $Z^2$, $p^1$, $p^2$, $q^1$, $q^2$, $r^1$, $r^2$, $s^1$, $s^2$, $t^1$, $t^2$, $u^1$, $u^2$ and v are as defined above.

Examples of the metal catalyst used herein include platinum group metals alone such as platinum (including platinum black), rhodium and palladium; platinum chlorides, chloroplatinic acids and chloroplatinates such as $H_2PtCl_4.xH_2O$, $H_2PtCl_6.xH_2O$, $NaHPtCl_6.xH_2O$, $KHPtCl_6.xH_2O$, $Na_2PtCl_6.xH_2O$, $K_2PtCl_4.xH_2O$, $PtCl_4.xH_2O$, $PtCl_2$ and $Na_2HPtCl_4.xH_2O$, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. Nos. 3,159,601, 3,159,662 and 3,775,452; supported catalysts comprising platinum group metals such as platinum black and palladium on supports of alumina, silica and carbon; rhodium-olefin complexes; chlorotris(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1 part by weight, more preferably 0.01 to 0.1 part by weight per 100 parts by weight of compounds (1) to (6) combined.

In the addition polymerization reaction, a solvent may be used if desired. Suitable solvents are hydrocarbon solvents such as toluene and xylene.

The polymerization temperature is preferably selected in a range of 40 to 150° C., more preferably 60 to 120° C., from the standpoints that the catalyst is not deactivated and the polymerization can be completed within a short time. While the polymerization time varies with the type and amount of monomers, it is preferably about 0.5 to about 100 hours, more preferably about 0.5 to about 30 hours for preventing moisture entry into the polymerization system. After the completion of reaction, the solvent if any is distilled off, obtaining the silicone skeleton-containing polymer as component (A).

The reaction procedure is not particularly limited. One exemplary procedure is by first heating one or more compounds selected from compounds (3) to (6), adding a metal catalyst thereto, and then adding compounds (1) and (2) dropwise over 0.1 to 5 hours.

The reactants are preferably combined in such amounts that a molar ratio of the total of hydrosilyl groups on compounds (1) and (2) to the total of alkenyl groups on at least one compound selected from compounds (3) to (6) may range from 0.67/1 to 1.67/1, more preferably from 0.83/1 to 1.25/1.

The Mw of the silicone skeleton-containing polymer may be controlled using a molecular weight control agent such as a monoallyl compound (e.g., o-allylphenol), monohydrosilane (e.g., triethylhydrosilane) or monohydrosiloxane.

[(B) Photoacid Generator]

The photoacid generator (PAG) as component (B) is not particularly limited as long as it is decomposed to generate an acid upon exposure to radiation, preferably of wavelength 190 to 500 nm. Since the inventive composition is highly compatible with the PAG, the PAG may be selected from a wide variety of such compounds.

The photoacid generator (B) serves as a curing catalyst. The photoacid generator (B) contains (B1) a photoacid generator in the form of an onium salt, which is also referred to as onium salt type PAG, hereinafter, and (B2) a photoacid generator other than an onium salt, which is also referred to as non-onium salt type PAG, hereinafter.

Exemplary onium salt type PAGs (B1) include sulfonium salts having the formula (B1-1) and iodonium salts having the formula (B1-2).

[Chem. 13]

(B1-1)

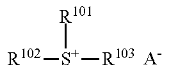

(B1-2)

$$R^{104}-I^+-R^{105}\ A^-$$

In formulae (B1-1) and (B1-2), $R^{101}$ to $R^{105}$ are each independently an optionally substituted $C_1$-$C_{12}$ alkyl group, an optionally substituted $C_6$-$C_{12}$ aryl group, or an optionally substituted $C_7$-$C_{12}$ aralkyl group. $A^-$ is a non-nucleophilic counter ion.

The alkyl groups may be straight, branched or cyclic and include, for example, methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl and adamantyl. The aryl groups include phenyl, naphthyl and biphenylyl. The aralkyl groups include benzyl and phenethyl.

Suitable substituents on these groups include oxo, straight, branched or cyclic $C_1$-$C_{12}$ alkoxy, straight, branched or cyclic $C_1$-$C_{12}$ alkyl, $C_6$-$C_{24}$ aryl, $C_7$-$C_{25}$ aralkyl, $C_6$-$C_{24}$ aryloxy, and $C_6$-$C_{24}$ arylthio groups.

Preferred examples of $R^{101}$ to $R^{105}$ include optionally substituted alkyl groups such as methyl, ethyl, propyl, butyl, cyclohexyl, norbornyl, adamantyl and 2-oxocyclohexyl; optionally substituted aryl groups such as phenyl, naphthyl, biphenylyl, 2-, 3- or 4-methoxyphenyl, ethoxyphenyl, 3- or 4-tert-butoxyphenyl, 2-, 3- or 4-methylphenyl, ethylphenyl, 4-tert-butylphenyl, 4-butylphenyl, dimethylphenyl, terphenylyl, biphenylyl, oxyphenyl, and biphenylylthiophenyl; and optionally substituted aralkyl groups such as benzyl and phenethyl. Of these, optionally substituted aryl groups and optionally substituted aralkyl groups are more preferred.

Examples of the non-nucleophilic counter ion include halide ions such as chloride and bromide; fluoroalkkanesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; fluoroalkanesulfonimide ions such as trifluoromethanesulfonimide; fluoroalkanesulfonylmethide ions such as tris(trifluoromethanesulfonyl)methide; and borate ions such as tetrakisphenylborate and tetrakis(pentafluorophenyl)borate.

Examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfomum trifluoromethanesulfonate, bis(p-tert-butoxyphenyl)phenylsulfonium trifluoromethanesulfonate, tris(p-tert-butoxyphenyl) sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl) sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl (2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl (4-thiophenoxyphenyl)sulfonium hexafluoroantimonate, [4-(4-biphenylylthio)phenyl]-4-biphenylylphenylsulfonium tris(trifluoromethanesulfonyl)methide, triphenylsulfonium tetrakis(fluorophenyl)borate, tris[4-(4-acetylphenyl)thiophenyl]sulfonium tetrakis(fluorophenyl)borate, triphenylsulfonium tetrakis(pentafluorophenyl)borate, and tris[4-(4-acetylphenyl)thiophenyl]sulfonium tetrakis (pentafluorophenyl)borate.

The non-onium salt type PAGs (B2) include diazomethane derivatives, glyoxime derivatives, β-ketosulfone derivatives, disulfone derivatives, nitrobenzyl sulfonate derivatives, sulfonic acid ester derivatives, imidoyl sulfonate derivatives, oxime sulfonate derivatives, iminosulfonate derivatives, and triazine derivatives.

Exemplary diazomethane derivatives include compounds having the formula (B2-1).

[Chem. 14]

(B2-1)

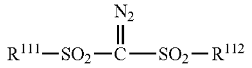

In formula (B2-1), $R^{111}$ and $R^{112}$ are each independently a $C_1$-$C_{12}$ alkyl group, $C_1$-$C_{12}$ haloalkyl group, optionally substituted $C_6$-$C_{12}$ aryl group, or $C_7$-$C_{12}$ aralkyl group.

The alkyl group may be straight, branched or cyclic and examples thereof are as exemplified above for $R^{101}$ to $R^{105}$. Examples of the haloalkyl group include trifluoromethyl, 1,1,1-trifluoroethyl, 1,1,1-trichloroethyl, and nonafluorobutyl.

Examples of the optionally substituted aryl group include phenyl; alkoxyphenyl groups such as 2-, 3- or 4-methoxyphenyl, 2-, 3- or 4-ethoxyphenyl, 3- or 4-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Examples of the aralkyl group include benzyl and phenethyl.

Exemplary glyoxime derivatives include compounds having the formula (B2-2).

[Chem. 15]

(B2-2)

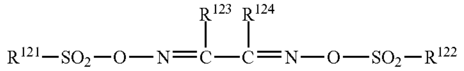

In formula (B2-2), $R^{121}$ to $R^{124}$ are each independently a $C_1$-$C_{12}$ alkyl group, $C_1$-$C_{12}$ haloalkyl group, optionally substituted $C_6$-$C_{12}$ aryl group, or $C_7$-$C_{12}$ aralkyl group. $R^{123}$ and $R^{124}$ may bond together to form a ring with the carbon atoms to which they are attached. In the case of ring formation, $R^{123}$ bonds with $R^{124}$ to form a $C_1$-$C_{12}$ straight or branched alkylene group.

Examples of the alkyl, haloalkyl, optionally substituted aryl and aralkyl groups are as exemplified above for $R^{111}$ and $R^{112}$. Examples of the straight or branched alkylene group include methylene, ethylene, propylene, butylene, and hexylene.

Examples of the diazomethane derivatives include bis (benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl) diazomethane, bis(n-butylsulfonyl)diazomethane, bis (isobutylsulfonyl)diazomethane, bis(sec-butylsulfonyl) diazomethane, bis(n-propylsulfonyl)diazomethane, bis (isopropylsulfonyl)diazomethane, bis(tert-butylsulfonyl) diazomethane, bis(n-pentylsulfonyl)diazomethane, bis (isopentylsulfonyl)diazomethane, bis(sec-pentylsulfonyl) diazomethane, bis(tert-pentylsulfonyl)diazomethane, 1-cyclohexylsulfonyl-1-(tert-butylsulfonyl)diazomethane, 1-cyclohexylsulfonyl-1-(tert-pentylsulfonyl)diazomethane, and 1-tert-pentylsulfonyl-1-(tert-butylsulfonyl)diazomethane.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-

α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Examples of the β-ketosulfone derivatives include 2-cyclohexylcarbonyl-2-(p-toluenesulfonyl)propane and 2-isopropylcarbonyl-2-(p-toluenesulfonyl)propane.

Examples of the disulfone derivatives include diphenyl disulfone and dicyclohexyl disulfone.

Examples of the nitrobenzyl sulfonate derivatives include 2,6-dinitrobenzyl p-toluenesulfonate and 2,4-dinitrobenzyl p-toluenesulfonate.

Examples of the sulfonic acid ester derivatives include 1,2,3-tris(methanesulfonyloxy)benzene, 1,2,3-tris(trifluoromethanesulfonyloxy)benzene, and 1,2,3-tris(p-toluenesulfonyloxy)benzene.

Examples of the imidoyl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and n-trifluoromethylsulfonyloxynaphthylimide.

Typical of the oxime sulfonate derivative is α-(benzenesulfoniumoxyimino)-4-methylphenylacetonitrile.

Examples of the iminosulfonate derivatives include (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile.

Also, 2-methyl-2-[(4-methylphenyl)sulfonyl]-1-[(4-methylthio)phenyl]-1-propane is useful as the non-onium salt type PAG (B2).

Of the PAGs (B), sulfonium salts are preferred as the onium salt type PAG (B1) and diazomethane derivatives are preferred as the non-onium salt type PAG (B2).

With respect to the amount of component (B), it is preferred from the photo-cure aspect that the total amount of the onium salt type PAG (B1) and the non-onium salt type PAG (B2) is 0.05 to 20 parts by weight, more preferably 0.05 to 5 parts by weight per 100 parts by weight of component (A). When the amount of component (B) is at least 0.05 part by weight, the risk that the amount of generated acid is too short for crosslinking reaction to take place is avoided. When the amount of component (B) is up to 20 parts by weight, it is possible to prevent the acid generator itself from increasing its light absorbance, and any loss of transparency is avoided. Also preferably, the amount of the onium salt type PAG (B1) is larger than the amount of the non-onium salt type PAG (B2). Specifically, the amount of the onium salt type PAG (B1) is preferably 125 to 500 parts by weight, more preferably 150 to 300 parts by weight per 100 parts by weight of the non-onium salt type PAG (B2).

[(C) Crosslinker]

Preferably the photosensitive resin composition further comprises (C) a crosslinker. The crosslinker undergoes condensation reaction with phenolic hydroxy groups or alkoxy groups represented by $R^{13}$, $R^{14}$, $R^{23}$ or $R^{24}$ on component (A) for thereby facilitating pattern formation and increasing the strength of the cured composition.

The preferred crosslinker is a resin having a Mw of 150 to 10,000, more preferably 200 to 3,000. This is because a resin with a Mw of at least 150 is photocurable whereas a resin with a Mw of up to 10,000 may not adversely affect the heat resistance of the cured composition.

Also preferably, the crosslinker is selected from nitrogen-containing compounds such as melamine, guanamine, glycoluril and urea compounds, having on the average at least two methylol and/or alkoxymethyl groups in the molecule, amino condensates modified with formaldehyde or formaldehyde-alcohol, phenol compounds having on the average at least two methylol or alkoxymethyl groups in the molecule, and epoxy compounds having on the average at least two epoxy groups in the molecule.

The preferred melamine compound has the formula (C1).

[Chem. 16]

(C1)

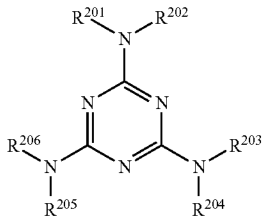

In formula (C1), $R^{201}$ to $R^{206}$ are each independently hydrogen, methylol, or $C_2$-$C_5$ alkoxymethyl, at least one of $R^{201}$ to $R^{206}$ being methylol or alkoxymethyl. Exemplary of the alkoxymethyl group are methoxymethyl and ethoxymethyl.

Suitable melamine compounds having formula (C1) include trimethoxymethylmonomethylolmelamine, dimethoxymethylmonomethylolmelamine, trimethylolmelamine, hexamethylolmelamine, hexamethoxymethylmelamine, and hexaethoxymethylmelamine.

The melamine compound having formula (C1) may be prepared by modifying a melamine monomer with formaldehyde into a methylol form according to a well-known technique, and optionally further modifying it with an alcohol into an alkoxy form. The alcohol used herein is preferably selected from lower alcohols, specifically alcohols of 1 to 4 carbon atoms.

Suitable guanamine compounds include tetramethylolguanamine, tetramethoxymethylguanamine and tetramethoxyethylguanamine.

Suitable glycoluril compounds include tetramethylolglycoluril and tetrakis(methoxymethyl)glycoluril.

Suitable urea compounds include tetramethylolurea, tetramethoxymethylurea, tetramethoxyethylurea, tetraethoxymethylurea, and tetrapropoxymethylurea.

Examples of the amino condensate modified with formaldehyde or formaldehyde-alcohol include melamine condensates modified with formaldehyde or formaldehyde-alcohol, and urea condensates modified with formaldehyde or formaldehyde-alcohol.

The modified melamine condensates are obtained, for example, by effecting addition polycondensation of a melamine having formula (C1) or an oligomer (e.g., dimer or trimer) thereof with formaldehyde in a standard way until a desired molecular weight is reached.

Examples of the urea condensate modified with formaldehyde or formaldehyde-alcohol include methoxymethylated urea condensates, ethoxymethylated urea condensates, and propoxymethylated urea condensates.

The modified urea condensates are prepared, for example, by modifying a urea condensate having a desired molecular weight with formaldehyde into a methylol form in a well-known manner, and optionally, further modifying it with an alcohol into an alkoxy form.

Examples of the phenol compound having on the average at least two methylol or alkoxymethyl groups in the molecule include (2-hydroxy-5-methyl)-1,3-benzenedimethanol and 2,2',6,6'-tetramethoxymethylbisphenol A.

Examples of the epoxy compound having on the average at least two epoxy groups in the molecule include bisphenol epoxy resins such as bisphenol A epoxy resins and bisphenol F epoxy resins, novolak epoxy resins such as phenol novolak epoxy resins and cresol novolak epoxy resins, triphenol alkane epoxy resins, biphenyl epoxy resins, dicyclopentadiene-modified phenol novolak epoxy resins, phenol aralkyl epoxy resins, biphenyl aralkyl epoxy resins, naphthalene ring-containing epoxy resins, glycidyl ester epoxy resins, cycloaliphatic epoxy resins, and heterocyclic epoxy resins.

When used, component (C) is preferably added in an amount of 0.5 to 50 parts, and more preferably 1 to 30 parts by weight per 100 parts by weight of component (A). At least 0.5 part of component (C) ensures sufficient cure upon light exposure. As long as the amount of component (C) is up to 50 parts, the proportion of component (A) in the resin composition is not reduced, allowing the cured composition to exert its effects to the full extent. The crosslinkers (C) may be used alone or in admixture.

[(D) Solvent]

The photosensitive resin composition may further comprise (D) a solvent. The solvent used herein is not particularly limited as long as the foregoing components and other additives are dissolvable therein. Organic solvents are preferred because the components are effectively dissolvable.

Illustrative examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol mono-tert-butyl ether acetate, and γ-butyrolactone. These solvents may be used alone or in admixture of two or more. Of these solvents, preferred are ethyl lactate, cyclohexanone, cyclopentanone, PGMEA, γ-butyrolactone, and mixtures thereof, in which the PAG is most soluble.

When the solvent (D) is used, it is preferred from the standpoints of compatibility and viscosity of the photosensitive resin composition that the solvent be added in an amount of 50 to 2,000 parts, more preferably 50 to 1,000 parts, and especially 50 to 100 parts by weight per 100 parts by weight of components (A) and (B) combined.

[(E) Quencher]

The photosensitive resin composition may further contain (E) a quencher. The quencher used herein is preferably a compound capable of suppressing the rate of diffusion when the acid generated by the PAG diffuses within the photosensitive resin coating. The inclusion of the quencher improves resolution, suppresses changes in sensitivity following exposure and reduces substrate and environment dependence, as well as improving the exposure latitude and the pattern profile.

Examples of the quencher include primary, secondary, and tertiary aliphatic amines, mixed amines, aromatic amines, heterocyclic amines, nitrogen-containing compounds having carboxy group, nitrogen-containing compounds having sulfonyl group, nitrogen-containing compounds having hydroxy group, nitrogen-containing compounds having hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-pentylamine, cyclopentylamine, hexylamine, cyclohexylamine, heptylamine, octylamine, nonylamine, decylamine, dodecylamine, cetylamine, methylenediamine, ethylenediamine, and tetraethylenepentamine.

Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine.

Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, and diaminonaphthalene; and pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methyl-2-pyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxy group include aminobenzoic acid, indolecarboxylic acid, and amino acid derivatives (e.g., nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable nitrogen-containing compounds having sulfonyl group include 3-pyridinesulfonic acid and pyridinium p-toluenesulfonate.

Examples of suitable nitrogen-containing compounds having hydroxy group, nitrogen-containing compounds having hydroxyphenyl group, and alcoholic nitrogen-containing compounds include 2-hydroxypyridine, aminocresol, 2-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide.

Suitable imide derivatives include phthalimide, succinimide, and maleimide.

Compounds of the formula (E1) are also useful as the quencher.

[Chem. 17]

$$(R^{301})_w—N—(R^{302})_{3-w} \quad (E1)$$

In formula (E1), w is 1, 2 or 3; $R^{301}$ is selected from substituent groups of the following formulas (E2) to (E4), $R^{302}$ is hydrogen or a $C_1$-$C_{20}$ alkyl group which may contain an ether bond or hydroxy moiety. Where two or three $R^{301}$ are present, two $R^{301}$ may bond together to form a ring with the nitrogen atom to which they are attached. Where two or three $R^{301}$ are present, they may be the same or different. Where two $R^{302}$ are present, they may be the same or different.

[Chem. 18]

$$—R^{303}—O—R^{304} \quad (E2)$$

(E3)

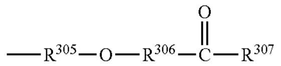

(E4)

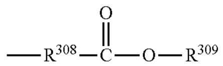

In formulae (E2) to (E4), $R^{303}$, $R^{305}$ and $R^{308}$ are each independently a straight or branched $C_1$-$C_4$ alkanediyl group. $R^{304}$ and $R^{307}$ are each independently hydrogen, a $C_1$-$C_{20}$ alkyl group which may contain at least one moiety selected from hydroxy moiety, ether bond, ester bond and lactone ring. $R^{306}$ is a single bond or a straight or branched $C_1$-$C_4$ alkanediyl group. $R^{309}$ is a $C_1$-$C_{20}$ alkyl group which may contain at least one moiety selected from hydroxy moiety, ether bond, ester bond and lactone ring.

Examples of the compound of formula (E1) include tris[2-(methoxymethoxy)ethyl]amine, tris[2-(2-methoxyethoxy)ethyl]amine, tris[2-(2-methoxyethoxymethoxy)ethyl]amine, tris[2-(1-methoxyethoxy)ethyl]amine, tris[2-(1-ethoxyethoxy)ethyl]amine, tris[2-(1-ethoxypropoxy)ethyl]amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)bis[2-(methoxycarbonyl)ethyl]amine, N-(2-acetoxyethyl)bis[2-(methoxycarbonyl)ethyl]amine, N-(2-hydroxyethyl)bis[2-(ethoxycarbonyl)ethyl]amine, N-(2-acetoxyethyl)bis[2-(ethoxycarbonyl)ethyl]amine, N-(3-hydroxy-1-propyl)bis[2-(methoxycarbonyl)ethyl]amine, N-(3-acetoxy-1-propyl)bis[2-(methoxycarbonyl)ethyl]amine, N-(2-methoxyethyl)bis[2-(methoxycarbonyl)ethyl]amine, N-butylbis[2-(methoxycarbonyl)ethyl]amine, N-butylbis[2-(2-methoxyethoxycarbonyl)ethyl]amine, N-methylbis(2-acetoxyethyl)amine, N-ethylbis(2-acetoxyethyl)amine, N-methylbis(2-pivaloyloxyethyl)amine, N-ethylbis[2-(methoxycarbonyloxy)ethyl]amine, N-ethylbis[2-(tert-butoxycarbonyloxy)ethyl]amine, tris(methoxycarbonylmethyl)amine, tris(ethoxycarbonylmethyl)amine, N-butylbis(methoxycarbonylmethyl)amine, N-hexylbis(methoxycarbonylmethyl)amine, and β-(diethylamino)-δ-valerolactone.

Component (E) may be formulated in an amount of 0 to 3 parts by weight per 100 parts by weight of component (A). When used, component (E) is preferably added from the standpoint of sensitivity in an amount of 0.01 to 2 parts by weight, and especially 0.05 to 1 part by weight, per 100 parts by weight of component (A). Component (E) may be used alone or in admixture.

[Other Additives]

Besides the aforementioned components, the photosensitive resin composition may contain other additives, for example, surfactants which are commonly used for improving coating properties.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Inter alia, Fluorad FC-430 and X-70-093 are preferred. The amount of the surfactant is preferably 0.01 to 5 parts by weight per 100 parts by weight of component (A).

The photosensitive resin composition may contain a silane coupling agent as the other additive. Inclusion of a silane coupling agent is effective for enhancing the adhesion of a resin coating of the composition to adherends. Suitable silane coupling agents include epoxy silane coupling agents and aromatic aminosilane coupling agents. The silane coupling agent may be used alone or in admixture. The amount of the silane coupling agent used is to not particularly limited. When used, the amount of the silane coupling agent is preferably 0.01 to 5% by weight of the photosensitive resin composition.

The photosensitive resin composition of the invention is prepared in any conventional way. For example, it may be prepared by agitating and mixing the aforementioned components and optionally passing the mixture through a filter.

The photosensitive resin composition is advantageously used, for example, as a film-forming material for semiconductor device protective film, interconnection protective film, coverlay film, solder mask, and TSV dielectric film, and an adhesive between substrates in three-dimensional laminates.

[Pattern Forming Process Using Photosensitive Resin Composition]

Another embodiment of the invention is a pattern forming process using the photosensitive resin composition defined above, the process comprising the steps of:

(i) applying the photosensitive resin composition onto a substrate to form a photosensitive resin coating thereon, (ii) exposing the photosensitive resin coating to radiation, and (iii) developing the exposed resin coating in a developer.

In step (i), the photosensitive resin composition is applied onto a substrate to form a photosensitive resin coating thereon. Examples of the substrate include silicon wafers, TSV silicon wafers, silicon wafers which have been thinned by back side polishing, plastic substrates, ceramic substrates, and substrates having a metal coating of Ni or Au wholly or partly on the surface by ion sputtering or plating. Also useful are substrates having grooves and/or holes having an opening width of 10 to 100 μm and a depth of 10 to 120 μm. It is noted that the opening width and depth of grooves or holes in a substrate may be measured under a scanning electron microscope.

One exemplary procedure of forming a photosensitive resin coating includes applying the photosensitive resin composition onto the substrate by any well-known technique, for example, dipping, spin coating, or roll coating, and optionally, prebaking (PB) the coating for efficient photo-cure reaction. Prebake may be performed, for example, at 40 to 140° C. for 1 minute to about 1 hour.

The coating weight of the photosensitive resin composition may be selected as appropriate for a particular purpose, preferably so as to form a coating having a thickness of 0.1 to 200 μm, more preferably 1 to 150 μm.

A pre-wetting technique of dispensing a solvent dropwise on a substrate prior to coating of the photosensitive resin composition may be employed for the purpose of making the coating thickness on the substrate surface more uniform. The type and amount of the solvent dispensed dropwise may be selected for a particular purpose. For example, alcohols such as isopropyl alcohol (IPA), ketones such as cyclohexanone, and glycols such as PGME are preferred. The solvent used in the photosensitive resin composition may also be used.

Next, in step (ii), the photosensitive resin coating is exposed to radiation. The exposure radiation is preferably of wavelength 1 to 600 nm, more preferably 10 to 600 nm, even more preferably 190 to 500 nm. Examples of radiation in the wavelength range include radiation of various wavelengths from radiation-emitting units, specifically UV radiation such as g-line, h-line or i-line, and deep UV (248 nm, 193 rmm). Among these, radiation of wavelength 248 to 436 nm is preferred. An appropriate exposure dose is 10 to 10,000 $mJ/cm^2$.

The exposure may be performed through a photomask. The photomask may be one in which a desired pattern is perforated. The material of the photomask, though not particularly limited, is preferably a material capable of shielding radiation of the above wavelength, for example, a light-shielding film of chromium or the like.

Further, post-exposure bake (PEB) may be performed for enhancing development sensitivity. PEB is preferably at 40 to 150° C. for 0.5 to 10 minutes. The exposed region of the resin coating is crosslinked during PEB to form an insolubilized pattern which is insoluble in a solvent as developer.

The exposure or PEB is followed by the step (iii) of developing the exposed resin coating in a developer to form a pattern. The preferred developers include alcohols such as IPA, ketones such as cyclohexanone, and glycols such as PGME. The solvent used in the photosensitive resin composition is also useful. Development is effected in a conventional manner, for example, by dipping the exposed coating-bearing substrate in the developer. The development is followed by washing, rinsing and drying if necessary. In this way, a resin coating having the desired pattern is obtained.

In step (iv), the patterned coating may be post-cured in an oven or on a hot plate at a temperature of preferably 100 to 250° C., more preferably 150 to 220° C. The post-cure temperature in the range of 100 to 250° C. is effective for increasing the crosslinking density of the photosensitive resin composition and removing any residual volatile matter, and preferable from the standpoints of adhesion to substrates, heat resistance, mechanical strength, electric properties, and bond strength. The post-cure time is preferably 10 minutes to 10 hours, more preferably 10 minutes to 3 hours. Using the photosensitive resin composition, a coating having excellent film properties is obtained from post-cure at a relatively low temperature of around 200° C. The resin coating as post-cured (or cured coating) has a thickness of typically 1 to 200 μm, preferably 5 to 50 μm.

When it is unnecessary to form a pattern, for example, when it is simply desired to form a uniform coating, the coating may be formed by modifying step (ii) of the pattern forming process so as to expose the resin coating to radiation of suitable wavelength directly, i.e., without the photomask.

[Photosensitive Dry Film]

A further embodiment of the invention is a photosensitive dry film comprising a support film and a photosensitive resin coating of the photosensitive resin composition thereon.

The photosensitive dry film (support film and photosensitive resin coating) is solid, and the photosensitive resin coating contains no solvent. This eliminates the risk that bubbles resulting from volatilization of solvent are left within the resin coating and between the resin coating and the rugged substrate. An adequate thickness range exists when the flatness and step coverage on the rugged substrate and substrate laminating gap are taken into account. The photosensitive resin coating preferably has a thickness of 5 to 200 μm, more preferably 10 to 100 μm.

Furthermore, the viscosity and fluidity of the photosensitive resin coating are closely correlated. As long as the photosensitive resin coating has a proper range of viscosity, it exhibits a sufficient fluidity to fill deeply even in a narrow gap or it softens to enhance the adhesion to the substrate. Accordingly, from the standpoint of fluidity, the photosensitive resin coating should preferably have a viscosity in the range of 10 to 5,000 Pa·s, more preferably 30 to 2,000 Pa·s, and even more preferably 50 to 300 Pa·s at a temperature of 80 to 120° C. It is noted that the viscosity is measured by a rotational viscometer.

The photosensitive dry film has the advantage that when tightly attached to a substrate having asperities (e.g., a substrate having grooves and/or holes having an opening width of 10 to 100 μm and a depth of 10 to 120 μm), the photosensitive resin coating is coated so as to conform to the asperities, achieving high planarity. Since the photosensitive resin coating is characterized by softening performance, high planarity is positively achievable. Further, if the photosensitive resin coating is in close contact with the substrate in a vacuum environment, generation of gaps therebetween is effectively inhibited.

The photosensitive dry film may be manufactured by coating the photosensitive resin composition to a support and drying the resin composition into a resin coating. An apparatus for manufacturing the photosensitive dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three roll bottom reverse coater, and four roll bottom reverse coater.

The support (film) is unwound from a supply roll in the film coater, passed across the head of the film coater where the photosensitive resin composition is coated onto the support to the predetermined buildup, and then moved through a hot air circulating oven at a predetermined temperature for a predetermined time, where the photosensitive resin coating is dried on the support. In this way, a photosensitive dry film is obtained. If necessary, the photosensitive dry film and a protective film which is unwound from another supply roll in the film coater are passed across a laminate roll under a predetermined pressure whereby the protective film is bonded to the photosensitive resin coating on the support. Thereafter, the laminate is wound up on a take-up shaft in the film coater. In this way, a protective film-bearing photosensitive dry film is obtained. Preferably, the oven temperature is 25 to 150° C., the pass time is 1 to 100 minutes, and the bonding pressure is 0.01 to 5 MPa.

The support film used herein may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET38x1-A3, PET38x1-V8 and PET38x1-X08 from Nippa Co., Ltd.

The protective film used herein may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 μm, more preferably 25 to 50 μm, for consistent manufacture of photosensitive dry film, and prevention of wrapping or curling on a take-up roll.

[Pattern Forming Process Using Photosensitive Dry Film]

A still further embodiment of the invention is a pattern forming process comprising the steps of:

(i') using the photosensitive dry film to form the photosensitive resin coating on a substrate, (ii) exposing the photosensitive resin coating to radiation, and (iii) developing the exposed resin coating in a developer to form a pattern.

In step (i'), the photosensitive dry film is used to form the photosensitive resin coating on a substrate. Specifically, the photosensitive dry film at its photosensitive resin coating is attached to a substrate to form the photosensitive resin coating on the substrate. When the photosensitive dry film is covered with the protective film, the dry film at its photosensitive resin coating is attached to a substrate after stripping the protective film therefrom, to form the photosensitive resin coating on the substrate. The dry film may be attached using a film attachment apparatus.

The substrate is as described and exemplified above in conjunction with the pattern forming process using the photosensitive resin composition. The film attachment apparatus is preferably a vacuum laminator. For example, the protective film is stripped from the dry film. In the vacuum chamber kept at a predetermined vacuum, the bare photosensitive resin coating of the dry film is closely bonded to the substrate on a table at a predetermined temperature, using a bonding roll under a predetermined pressure. Preferably, the temperature is 60 to 120° C., the pressure is 0 to 5.0 MPa, and the vacuum is 50 to 500 Pa.

The attachment of dry film may be repeated plural times, if necessary to obtain a photosensitive resin coating having the desired thickness. The attachment step is repeated 1 to 10 times, for example, before a photosensitive resin coating having a thickness of the order of 10 to 1,000 μm, preferably 100 to 500 μm is obtained.

The assembly of the photosensitive resin coating on the substrate may be prebaked, if necessary, for facilitating photo-cure reaction of the photosensitive resin coating or enhancing the adhesion between the resin coating and the substrate. Prebake may be, for example, at 40 to 140° C. for 1 minute to 1 hour.

Like the pattern forming process using the photosensitive resin composition, the photosensitive resin coating attached to the substrate may be subjected to steps of (ii) exposing the photosensitive resin coating to radiation, (iii) developing the exposed resin coating in a developer, and optionally (iv) post-curing the coating to form a pattern. It is noted that the support of the photosensitive dry film may be removed before prebake or before PEB, by mechanical stripping or the like, depending on a particular process.

The resin coating obtained from the photosensitive resin composition or photosensitive dry film has excellent properties including heat resistance, flexibility, electric insulation, mechanical properties, and substrate adhesion. The resin coating is thus best suited as a protective film for electric and electronic parts such as semiconductor devices and as a substrate bonding coating.

[Substrate Bonding Method]

The photosensitive resin composition and photosensitive dry film may also be used as an adhesive (or substrate bonding material) for bonding two substrates. The substrate bonding method may be a method of joining a first substrate having a coating of the photosensitive resin composition or photosensitive dry film formed thereon to a second substrate via the coating under a sufficient set of temperature and pressure conditions. The coating becomes an adhesive layer between the substrates. One or both of the first substrate having a resin coating and the second substrate may have been cut into a chip such as by dicing.

The preferred bonding conditions include a heating temperature of 50 to 200° C. and a heating time of 1 to 60 minutes. Any desired bonding units may be used, for example, a wafer bonder for bonding wafers under reduced pressure and under a certain load, or a flip chip bonder for performing chip-wafer or chip-chip bonding.

The thus joined or bonded substrates may be post-cured under the same conditions as in the above step (iv), for thereby increasing the crosslinking density of the resin coating to enhance substrate bonding force. The post-cure treatment enhances the bonding force of the adhesive layer between substrates, resulting in a permanent bond. It is noted that crosslinking reaction occurs by the heat during bonding. Since this crosslinking reaction is not accompanied with side reaction entailing degassing, no bonding voids are induced when the photosensitive resin composition is used as the substrate adhesive.

[Laminate]

A still further embodiment of the invention is a laminate comprising a substrate and a photosensitive resin coating formed thereon. The substrate is as described and exemplified in the pattern forming process using the photosensitive resin composition, and preferably a rugged substrate (e.g., a substrate provided with grooves and/or holes having an opening width of 10 to 100 μm and a depth of 10 to 120 μm). The laminate having a photosensitive resin coating formed thereon is improved in adhesion between the substrate and the resin coating and provides high flatness even when the substrate is rugged.

EXAMPLES

Synthesis Examples, Examples and Comparative Examples are given below for illustrating the invention, but the the invention is not limited thereto. In Synthesis Examples, the Mw of a polymer is measured by GPC versus monodisperse polystyrene standards using GPC column TSKGEL Super HZM-H (Tosoh Corp.) under analytical conditions: flow rate 0.6 mL/min, tetrahydrofuran elute, and column temperature 40° C.

Compounds (S-1) to (S-6) used in Synthesis Examples are shown below.

[Chem. 19]

(S-1)

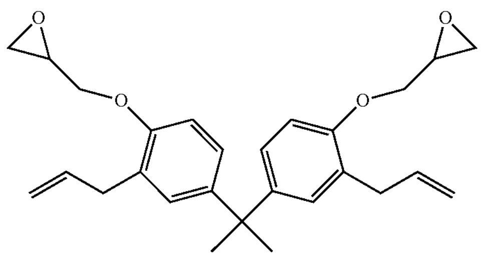

(S-2)

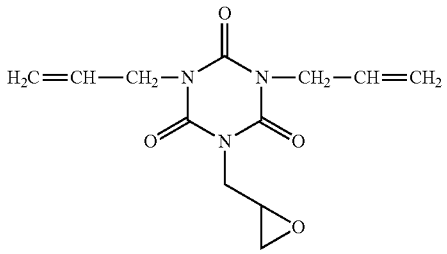

(S-3)

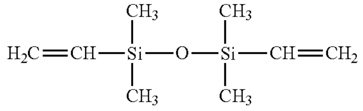

-continued (S-4)

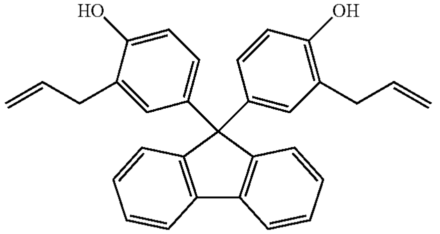

(S-5)

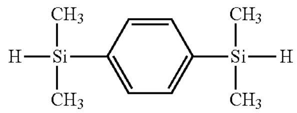

(S-6)

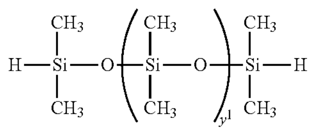

[1] Synthesis of Silicone Skeleton-Containing Polymers

[Synthesis Example 1-1] Synthesis of Resin 1

A 3-L flask equipped with a stirrer, thermometer, nitrogen purge line and reflux condenser was charged with 84.0 g (0.2 mol) of Compound (S-1), 39.7 g (0.15 mol) of Compound (S-2), 46.5 g (0.25 mol) of Compound (S-3), and 2,000 g of toluene, and heated at 70° C. Thereafter, 1.0 g of a toluene solution of chloroplatinic acid (platinum concentration 0.5 wt %) was added, and 38.8 g (0.20 mol) of Compound (S-5) and 553.4 g (0.20 mol) of Compound (S-6) wherein $y^1$=38 were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 1. On $^1$H-NMR spectroscopy analysis (Bruker Corp.), Resin 1 was found to contain repeat units (a1), (b1), (a2), (b2), (a3), (b3), (a4) and (b4). Resin 1 had a Mw of 38,000 and a silicone content of 67.2 wt %.

[Synthesis Example 1-2] Synthesis of Resin 2

A 3-L flask equipped with a stirrer, thermometer, nitrogen purge line and reflux condenser was charged with 53.0 g (0.20 mol) of Compound (S-2), 172.0 g (0.40 mol) of Compound (S-4), 9.3 g (0.05 mol) of Compound (S-3), and 2,000 g of toluene, and heated at 70° C. Thereafter, 1.0 g of a toluene solution of chloroplatinic acid (platinum concentration 0.5 wt %) was added, and 29.1 g (0.15 mol) of Compound (S-5) and 430.5 g (0.7 mol) of Compound (S-6) wherein $y^1$=8 were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 2. On $^1$H-NMR spectroscopy analysis (Bruker Corp.), Resin 2 was found to contain repeat units (a1), (b1), (a2), (b2), (a3), (b3), (a4) and (b4). Resin 2 had a Mw of 35,000 and a silicone content of 53.6 wt %.

[Synthesis Example 1-3] Synthesis of Resin 3

A 3-L flask equipped with a stirrer, thermometer, nitrogen purge line and reflux condenser was charged with 84.0 g (0.20 mol) of Compound (S-1), 132.5 g (0.50 mol) of Compound (S-2), and 2,000 g of toluene, and heated at 70° C. Thereafter, 1.0 g of a toluene solution of chloroplatinic acid (platinum concentration 0.5 wt %) was added, and 58.2 g (0.30 mol) of Compound (S-5) and 830.1 g (0.3 mol) of Compound (S-6) wherein $y^1$=38 were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 3. On $^1$H-NMR spectroscopy analysis (Bruker Corp.), Resin 3 was found to contain repeat units (a1), (b1), (a3), (b3), (a4) and (b4). Resin 3 had a Mw of 32,000 and a silicone content of 75.5 wt %.

[Synthesis Example 4] Synthesis of Resin 4

A 3-L flask equipped with a stirrer, thermometer, nitrogen purge line and reflux condenser was charged with 132.5 g (0.50 mol) of Compound (S-2), 107.5 g (0.25 mol) of Compound (S-4), 18.6 g (0.10 mol) of Compound (S-3), and 2,000 g of toluene, and heated at 70° C. Thereafter, 1.0 g of a toluene solution of chloroplatinic acid (platinum concentration 0.5 wt %) was added, and 9.7 g (0.05 mol) of Compound (S-5) and 276.7 g (0.45 mol) of Compound (S-6) wherein $y^1$=38 were added dropwise over 1 hour. The molar ratio of the total of hydrosilyl groups to the total of alkenyl groups was 1/1. At the end of dropwise addition, the reaction solution was heated at 100° C. and aged for 6 hours. Toluene was distilled off in vacuum from the reaction solution, yielding Resin 4. On $^1$H-NMR spectroscopy analysis (Bruker Corp.), Resin 4 was found to contain repeat units (a2), (b2), (a3), (b3), (a4) and (b4). Resin 4 had a Mw of 36,000 and a silicone content of 58.4 wt %.

[2] Synthesis of Acrylic Resin

[Synthesis Example 2-1] Synthesis of Acrylic Resin 1

A flask equipped with a stirrer, reflux condenser, inert gas supply line and thermometer was charged with 1 g of 2,2'-azobisisobutyronitrile (AIBN), 70 g of propylene glycol monomethyl ether acetate (PGMEA) and 70 g of toluene. Then 32.6 of acrylic acid and 40 g of methacrylic acid were added thereto and thoroughly stirred under nitrogen gas atmosphere. The flask was heated at 80° C. The reaction mixture was stirred for 6 hours while maintaining a temperature of 80±2° C., yielding a solution of Acrylic Resin 1. PGMEA was added to the solution so that the concentration of Acrylic Resin 1 might be 60% by weight. Acrylic Resin 1 had a Mw of 15,000.

[Synthesis Example 2-2] Synthesis of Acrylic Resin 2

A flask equipped with a stirrer, reflux condenser, inert gas supply line and thermometer was charged with 1 g of AIBN, 70 g of PGMEA and 70 g of toluene. Then 25 of acrylic acid and 43.9 g of methyl acrylate were added thereto and thoroughly stirred under nitrogen gas atmosphere. The flask was heated at 80° C. The reaction mixture was stirred for 6 hours while maintaining a temperature of 80±2° C., yielding a solution of Acrylic Resin 2. PGMEA was added to the solution so that the concentration of Acrylic Resin 2 might be 60% by weight. Acrylic Resin 2 had a Mw of 17,000.

[3] Preparation of Photosensitive Resin Composition

Examples 1 to 8 and Comparative Examples 1 to 4

Photosensitive resin compositions of Examples 1 to 8 and Comparative Examples 1 to 4 were prepared by blending components in accordance with the formulation shown in Table 1, agitating, mixing and dissolving them at room temperature, and precision filtering through a Teflon® filter having a size of 1.0 μm.

TABLE 1

| Component | | Example | | | | | | | | Comparative Example | | | |
|---|---|---|---|---|---|---|---|---|---|---|---|---|---|
| (pbw) | | 1 | 2 | 3 | 4 | 5 | 6 | 7 | 8 | 1 | 2 | 3 | 4 |
| (A) | Resin 1 | 100 | 100 | 100 | — | — | — | — | — | 100 | — | — | — |
| | Resin 2 | — | — | — | 100 | — | — | — | — | — | — | — | — |
| | Resin 3 | — | — | — | — | 100 | — | — | — | — | — | — | — |
| | Resin 4 | — | — | — | — | — | 100 | 100 | 100 | — | 100 | — | — |
| | Acrylic Resin 1 | — | — | — | — | — | — | — | — | — | — | 100 | — |
| | Acrylic Resin 2 | — | — | — | — | — | — | — | — | — | — | — | 100 |
| (B1) | PAG-1 | 2 | 2 | — | — | — | 2 | 3 | 1.5 | 1 | — | — | — |
| | PAG-2 | — | — | 2 | 2 | 2 | — | — | — | — | 1 | — | — |
| (B2) | PAG-3 | 1 | — | 1 | 1 | — | — | — | — | — | — | — | — |
| | PAG-4 | — | 1 | — | — | 1 | 1 | 1 | 1 | — | — | — | — |
| | PAG-5 | — | — | — | — | — | — | — | — | — | — | 2 | 1 |
| | PAG-6 | — | — | — | — | — | — | — | — | — | — | 1 | 2 |
| (C) | CL-1 | 20 | 20 | 20 | 20 | 20 | 20 | 20 | 20 | 20 | 20 | — | — |
| | CL-2 | — | — | — | — | — | — | — | — | — | — | 20 | 20 |
| (D) | cyclopentanone | 55 | 55 | 55 | 55 | 55 | 55 | 55 | 55 | 55 | 55 | — | — |
| | PGMEA | — | — | — | — | — | — | — | — | — | — | 55 | 55 |
| (E) | AM-1 | 0.3 | 0.3 | 0.3 | 0.3 | 0.3 | 0.3 | 0.3 | 0.3 | 0.3 | 0.3 | — | — |

The photoacid generators PAG-1 to PAG-6, crosslinkers CL-1 and CL-2, and quencher AM-1 in Table 1 are identified below.

PAG-1 to PAG-6

[Chem. 20]

PAG-1

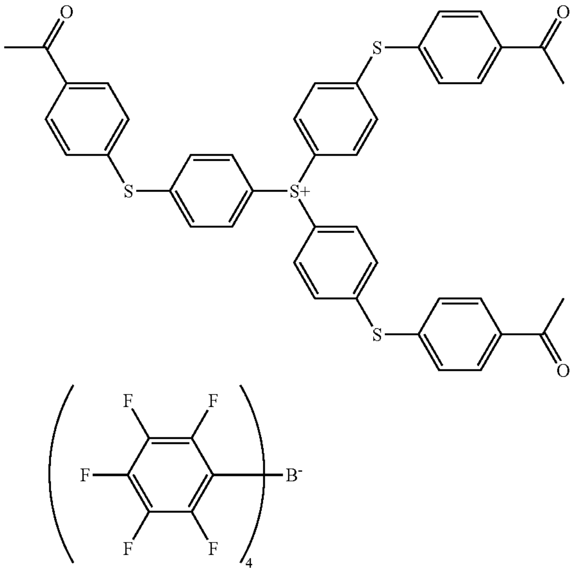

-continued

PAG-2

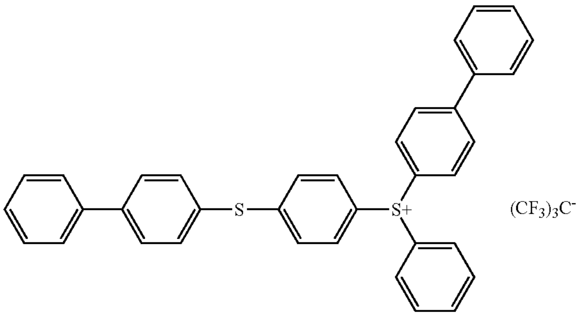

[Chem. 21]

PAG-3

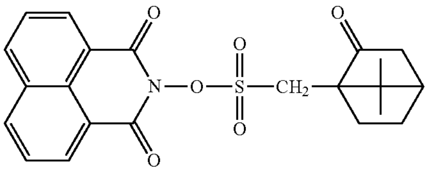

PAG-4

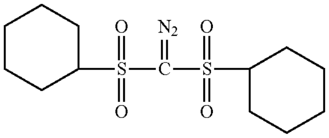

PAG-5

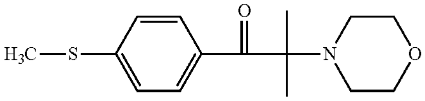

-continued

PAG-6

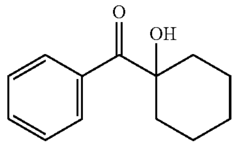

CL-1, CL-2

[Chem. 22]

CL-1

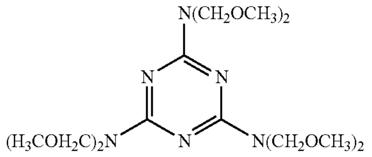

CL-2

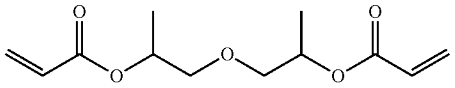

AM-1

[Chem. 23]

AM-1

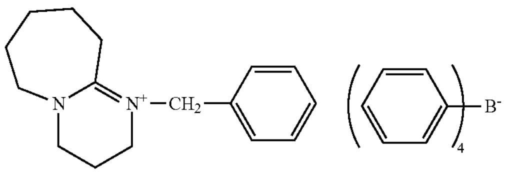

[4] Preparation of Photosensitive Dry Film

A die coater was used as the film coater and a polyethylene terephthalate (PET) film of 38 μm thick used as the support film. Each of the photosensitive resin compositions of Examples 1 to 8 and Comparative Examples 1 to 4 was coated onto the support film. The coated film was passed through a hot air circulating oven (length 4 m) set at 100° C. over 5 minutes for drying to form a photosensitive resin coating on the support film, yielding a photosensitive dry film. Using a laminating roll, a polyethylene film of 40 μm thick as the protective film was bonded to the photosensitive resin coating under a pressure of 1 MPa, yielding a protective film-bearing photosensitive dry film. The thickness of each photosensitive resin coating is tabulated in Table 2. The thickness of a resin coating was measured by an optical interference film thickness gauge (by Screen Semiconductor Solutions Co., Ltd.).

[5] Evaluation of Resin Coating (1) Evaluation of Pattern Formation

From the protective film-bearing photosensitive dry film, the protective film was stripped off. Using a vacuum laminator TEAM-100RF (Takatori Corp.) with a vacuum chamber set at a vacuum of 80 Pa, the photosensitive resin coating on the support film was closely bonded to a rugged silicon substrate. The temperature was 100° C. After restoration of atmospheric pressure, the substrate was taken out of the laminator, and the support film was stripped off. Then the photosensitive resin coating was prebaked on a hot plate at 110° C. for 5 minutes for enhancing adhesion to the substrate. Using a contact aligner exposure tool, the photosensitive resin coating was exposed to radiation of 365 nm through a mask having a line-and-space pattern and a contact hole pattern. After exposure, the coated substrate was baked (PEB) on a hot plate at 130° C. for 5 minutes and cooled. This was followed by spray development in PGMEA for 300 seconds for forming a pattern of the resin coating.

The patterned photosensitive resin coating on the substrate was post-cured in an oven at 180° C. for 2 hours while the oven was purged with nitrogen. Under a scanning electron microscope (SEM), the contact hole patterns of 100 μm, 80 μm, 60 μm, 40 μm, and 20 μm were observed in cross section, with the minimum hole pattern in which holes extended down to the film bottom being reported as maximum resolution. From the cross-sectional photo, the contact hole pattern of 40 μm was evaluated for perpendicularity, and rated excellent (◎) for perpendicular pattern, good (○) for slightly inversely tapered profile, fair (Δ) for inversely tapered profile, and poor (x) for opening failure. The results are shown in Table 2.

(2) Evaluation of Reliability (Adhesion and Crack Resistance)

Using a spin coater, each of the photosensitive resin compositions of Examples 1 to 8 and Comparative Examples 1 to 4 was coated onto a silicon wafer so as to build up a thickness of 10 μm. The solvent was removed by heating the coating on a hot plate at 100° C. for 3 minutes for drying.

Using a Mask Aligner MA8 (SUSS MicroTec AG), the resin coating on the wafer was exposed over its entire surface to radiation of wavelength 365 nm from a high-pressure mercury lamp. The coating was PEB at 140° C. for 5 minutes and dipped in PGMEA for 5 minutes. The resin coating which remained after these operations was heated in an oven at 190° C. for 1 hour, yielding a resin coating.

The wafer was cut into specimens of 10 mm squares using a dicing saw with a dicing blade (DAD685 by DISCO Co., spindle revolution 40,000 rpm, cutting rate 20 mm/sec). Ten specimens for each Example were examined by a thermal cycling test (test of holding at −25° C. for 10 minutes and holding at 125° C. for 10 minutes, the test being repeated 1,000 cycles). After the test, it was observed under an optical microscope whether or not the resin coating peeled from the wafer and whether or not the resin coating cracked. The sample was rated "good" when all specimens did not peel or crack, "peeled" when one or more specimens peeled, and "cracked" when one or more specimens cracked. The results are shown in Table 2.

(3) Evaluation of Heat Resistance

Prior to a heating test, the weight of a specimen (prepared in the above reliability evaluation) was measured. The specimen was held in an oven at 200° C. for 1,000 hours, taken out of the oven, and measured for weight again. The sample was rated good when the weight change before and after the test was less than 0.5%, and poor when the weight change before and after the test was equal to or more than 0.5%. The results are shown in Table 2.

TABLE 2

| | | Example | | | | | | | | Comparative Example | | | |
|---|---|---|---|---|---|---|---|---|---|---|---|---|---|
| | | 1 | 2 | 3 | 4 | 5 | 6 | 7 | 8 | 1 | 2 | 3 | 4 |
| Thickness of photosensitive resin coating (μm) | | 10 | 10 | 10 | 10 | 10 | 10 | 10 | 10 | 10 | 10 | 10 | 10 |
| Pattern formation | | ○ | ◎ | ○ | ○ | ◎ | ◎ | ◎ | ○ | X | X | X | X |
| Reliability | Adhesion | Good | Good | Good | Good | Good | Good | Good | Good | Peeled | Peeled | Peeled | Peeled |
| | Crack resistance | Good | Good | Good | Good | Good | Good | Good | Good | Cracked | Cracked | Cracked | Cracked |
| Heat resistance | | Good | Good | Good | Good | Good | Good | Good | Good | Poor | Poor | Poor | Poor |

The invention claimed is:

1. A photosensitive resin composition comprising of:

(A) a silicone skeleton-containing polymer;

(B) a photoacid generator, (C) optionally, a crosslinker;

(D) optionally, a solvent; and (E) optionally, a quencher;

wherein the silicone skeleton-containing polymer (A) consisting of:

repeat units having the formulae (a1), (a3), (a4), (b1), (b3) and (b4), and optionally repeat units having the formulae (a2), and (b2):

(a1)

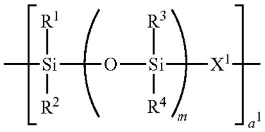

(b1)

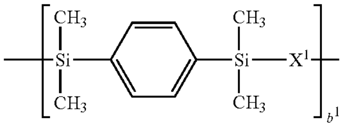

(a2)

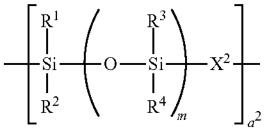

(b2)

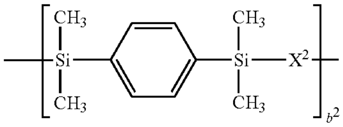

(a3)

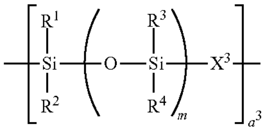

(b3)

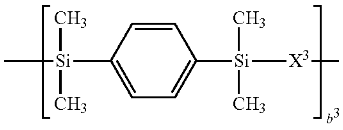

-continued (a4)

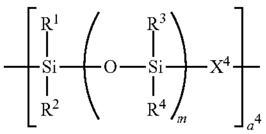

(b4)

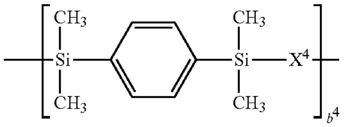

wherein $R^1$ to $R^4$ are each independently a $C_1$-$C_8$ monovalent hydrocarbon group, m is an integer of 1 to 600, $a^1$ to $a^4$ and $b^1$ to $b^4$ are numbers in the range: $0<a^1<1$, $0<a^2<1, 0<a^3<1, 0<a^4<1, 0<b^1<1, 0<b^2<1, 0<b^3<1$, $0<b^4 1, 0<a^1+a^2+a^3+a^4<1, 0<b^1+b^2+b^3+b^4<1$, and $a^1+a^2+a^3+a^4+b^1+b^2+b^3+b^4=1$, $X^1$ is a divalent group having the formula (X1), $X^2$ is a divalent group having the formula (X2), $X^3$ is a divalent group having the formula (X3), $X^4$ is a divalent group having the formula (X4), (X1)

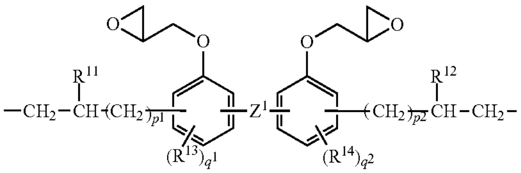

wherein $Z^1$ is a single bond, methylene group, propane-2,2-diyl group, 1,1,1,3,3,3-hexafluoropropane-2,2-diyl group or fluorene-9,9-diyl group, $R^{11}$ and $R^{12}$ are each independently hydrogen or methyl, $R^{13}$ and $R^{14}$ are each independently a $C_1$-$C_4$ alkyl group or $C_1$-$C_4$ alkoxy group, $p^1$ and $p^2$ are each independently an integer of 0 to 7, $q^1$ and $q^2$ are each independently an integer of 0 to 2, (X2)

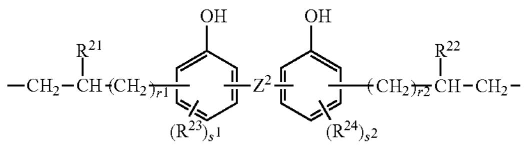

wherein $Z^2$ is a single bond, methylene group, propane-2,2-diyl group, 1,1,1,3,3,3-hexafluoropropane-2,2-diyl group or fluorene-9,9-diyl group, $R^{21}$ and $R^{22}$ are each independently hydrogen or methyl, $R^{23}$ and $R^{24}$ are each independently a $C_1$-$C_4$ alkyl group or $C_1$-$C_4$ alkoxy group, $r^1$ and $r^2$ are each independently an integer of 0 to 7, $s^1$ and $s^2$ are each independently an integer of 0 to 2, (X3)

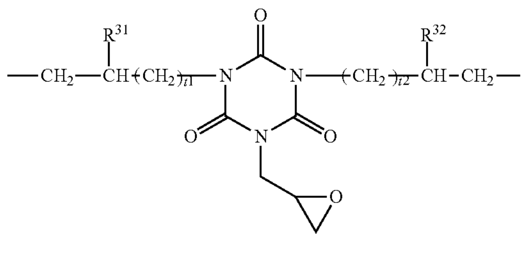

wherein $R^{31}$ and $R^{32}$ are each independently hydrogen or methyl, $t^1$ and $t^2$ are each independently an integer of 0 to 7, (X4)

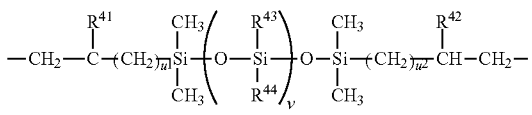

wherein $R^{41}$ and $R^{42}$ are each independently hydrogen or methyl, $R^{43}$ and $R^{44}$ are each independently a $C_1$-$C_8$ monovalent hydrocarbon group, $u^1$ and $u^2$ are each independently an integer of 0 to 7, and v is an integer of 0 to 600, wherein the photoacid generator (B) contains (B1) a photoacid generator in the form of an onium salt and (B2) a photoacid generator other than an onium salt.

2. The photosensitive resin composition of claim 1 wherein the silicone skeleton-containing polymer (A) comprises repeat units having the formulae (a1) (a2), (a3), (a4), (b1), (b2), (b3) and (b4).

3. The photosensitive resin composition of claim 1, further comprising (C) a crosslinker.

4. The photosensitive resin composition of claim 1, further comprising (D) a solvent.

5. The photosensitive resin composition of claim 1, further comprising (E) a quencher.

6. A photosensitive resin coating obtained from the photosensitive resin composition of claim 1.

7. A photosensitive dry film comprising a support film and the photosensitive resin coating of claim 6 thereon.

8. A laminate comprising a substrate and the photosensitive resin coating of claim 6 thereon.

9. A pattern forming process comprising the steps of:

(i) applying the photosensitive resin composition of claim 1 onto a substrate to form a photosensitive resin coating thereon, (ii) exposing the photosensitive resin coating to radiation, and (iii) developing the exposed photosensitive resin coating in a developer to form a pattern.

10. A pattern forming process comprising the steps of:

(i') applying the photosensitive dry film of claim 7 onto a substrate to form a photosensitive resin coating thereon, (ii) exposing the photosensitive resin coating to radiation, and (iii) developing the exposed photosensitive resin coating in a developer to form a pattern.

11. The pattern forming process of claim 9, further comprising step (iv) of post-curing the patterned photosensitive resin coating at a temperature of 100 to 250° C.

12. The photosensitive resin composition of claim 1, wherein the crosslinker is selected from the group consisting of melamine, guanamine, glycoluril and urea compounds, phenol compounds, epoxy compounds.

13. The photosensitive resin composition of claim 1, wherein the quencher is an amine compound.

* * * * *